(12) United States Patent
Fukui et al.

(10) Patent No.: US 12,421,621 B2
(45) Date of Patent: Sep. 23, 2025

(54) UNDERLYING SUBSTRATE

(71) Applicant: NGK INSULATORS, LTD., Nagoya (JP)

(72) Inventors: Hiroshi Fukui, Obu (JP); Morimichi Watanabe, Nagoya (JP); Jun Yoshikawa, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 1054 days.

(21) Appl. No.: 17/443,828

(22) Filed: Jul. 28, 2021

(65) Prior Publication Data

US 2021/0355602 A1 Nov. 18, 2021

Related U.S. Application Data

(63) Continuation of application No. PCT/JP2020/006312, filed on Feb. 18, 2020.

(30) Foreign Application Priority Data

Mar. 28, 2019 (JP) .................... 2019-063602

(51) Int. Cl.
*C30B 29/16* (2006.01)
*C30B 25/18* (2006.01)
*C30B 29/40* (2006.01)
*C30B 29/66* (2006.01)

(52) U.S. Cl.
CPC ............ *C30B 25/183* (2013.01); *C30B 29/16* (2013.01); *C30B 29/406* (2013.01); *C30B 29/66* (2013.01)

(58) Field of Classification Search
USPC ........................................... 428/702
See application file for complete search history.

(56) References Cited

U.S. PATENT DOCUMENTS 6,107,213 A * 8/2000 Tayanaka ............ H01L 21/0245
257/E21.216
6,143,629 A * 11/2000 Sato .................. H01L 21/76262
257/E21.216

(Continued)

FOREIGN PATENT DOCUMENTS

JP  2000-106348 A  4/2000
JP  2014-072533 A  4/2014

(Continued)

OTHER PUBLICATIONS

Shinkosha Co., Ltd.; Properties of Sapphire; Jun. 2021; chrome-extension://efaidnbmnnnibpcajpcglclefindmkaj/https://www.shinkosha.com/english/wp-content/uploads/sites/Feb. 2021/07/properties-ofsapphire_eng.pdf (Year: 2021).*

(Continued)

*Primary Examiner* — Humera N. Sheikh
(74) *Attorney, Agent, or Firm* — BURR PATENT LAW, PLLC

(57) ABSTRACT

Provided is a ground substrate includes an orientation layer used for crystal growth of a nitride or oxide of a Group 13 element. The front surface of the orientation layer on the side used for the crystal growth is composed of a material having a corundum-type crystal structure having an a-axis length and/or c-axis length larger than that of sapphire. A plurality of pores are present in the orientation layer.

12 Claims, 1 Drawing Sheet

(56) References Cited

U.S. PATENT DOCUMENTS

| | | | |
|---|---|---|---|
| 6,344,375 B1* | 2/2002 | Orita | H01L 21/0254 438/455 |
| 2013/0277684 A1* | 10/2013 | Araki | H01L 21/02458 438/478 |
| 2015/0194479 A1* | 7/2015 | Kaneko | H01L 21/0242 257/43 |
| 2017/0179249 A1* | 6/2017 | Oda | H01L 21/02565 |

FOREIGN PATENT DOCUMENTS

| | | |
|---|---|---|
| JP | 2016-025256 A | 2/2016 |
| JP | 2016-100593 A | 5/2016 |

OTHER PUBLICATIONS

Riena Jinno, et al., "Reduction in Edge Dislocation Density in Corundum-Structured a-$Ga_2O_3$ Layers on Sapphire Substrates with Quasi-Graded α-$(Al,Ga)_2O_3$ Buffer Layers," *Applied Physics Express*, The Japan Society of Applied Physics, vol. 9, 2016, pp. 071101-071101-4.

Hai-Sheng Qian, et al., "Template-Fee Synthesis of Highly Uniform α-$Ga_2O_3$ and β-$Ga_2O_3$," *Crystal Growth & Design*, vol. 8, No. 4, 2008, pp. 1282-1287.

International Search Report and Written Opinion (Application No. PCT/JP2020/006312) dated Apr. 21, 2020 (with English translation).

* cited by examiner

UNDERLYING SUBSTRATE

CROSS-REFERENCE TO RELATED APPLICATIONS

This application is a continuation application of PCT/JP2020/006312 filed Feb. 18, 2020, which claims priority to Japanese Patent Application No. 2019-063602 filed Mar. 28, 2019, the entire contents all of which are incorporated herein by reference.

BACKGROUND OF THE INVENTION

1. Field of the Invention

The present invention relates to a ground substrate used for crystal growth of a nitride or oxide of a Group 13 element.

2. Description of the Related Art

In recent years, semiconductor devices using gallium nitride (GaN) have been put into practical use. For example, a device in which an n-type GaN layer, a multiple quantum well layer (MQW) in which a quantum well layer composed of an InGaN layer and a barrier layer composed of a GaN layer are alternately stacked, and a p-type GaN layer are sequentially stacked on a sapphire substrate has been mass-produced.

Further, research and development of corundum phase type α-gallium oxide ($\alpha$-$Ga_2O_3$), which has the same crystal structure as sapphire, is being actively carried out. In fact, $\alpha$-$Ga_2O_3$ has a large bandgap of 5.3 eV, and is expected as a material for power semiconductor elements. For example, Patent Literature 1 (JP2014-72533A) discloses an example in which $\alpha$-$Ga_2O_3$ film is formed as a semiconductor layer on a sapphire substrate in a semiconductor device formed of a ground substrate having a corundum-type crystal structure, a semiconductor layer having a corundum-type crystal structure, and an insulating film having a corundum-type crystal structure. Further, Patent Literature 2 (JP2016-25256A) discloses a semiconductor device including an n-type semiconductor layer containing a crystalline oxide semiconductor having a corundum structure as a main component, a p-type semiconductor layer containing an inorganic compound having a hexagonal crystal structure as a main component, and an electrode, in which a diode is fabricated by forming $\alpha$-$Ga_2O_3$ film having a corundum structure which is a metastable phase as an n-type semiconductor layer and an $\alpha$-$Rh_2O_3$ film having a hexagonal crystal structure as a p-type semiconductor layer on a c-plane sapphire substrate in an example.

It is known that, in these semiconductor devices, better characteristics can be obtained when there are fewer crystal defects in the material. In particular, since a power semiconductor is required to have excellent withstand voltage characteristics, it is desirable to reduce crystal defects. This is because the dielectric breakdown electric field characteristics depend on the number of crystal defects. However, in the case of GaN and $\alpha$-$Ga_2O_3$, a single-crystal substrate having few crystal defects has not been put into practical use, and the single crystal substrate is generally formed by heteroepitaxial growth on a sapphire substrate having different lattice constants from those of these materials. Therefore, crystal defects due to the difference in lattice constant with sapphire are likely to occur. For example, in a case where $\alpha$-$Ga_2O_3$ is formed on the c-plane of sapphire, the a-axis length (4.754 Å) of sapphire ($\alpha$-$Al_2O_3$) and the a-axis length (4.983 Å) of $\alpha$-$Ga_2O_3$ differ by about 5%, and this difference is the main cause of crystal defects.

It has been reported that defects are reduced by forming a buffer layer between the sapphire and the $\alpha$-$Ga_2O_3$ layer when forming the $\alpha$-$Ga_2O_3$ layer as an approach for reducing crystal defects by reducing the difference in lattice constants between the sapphire and the semiconductor layer. For example, Non-Patent Literature 1 (Applied Physics Express, vol. 9, pages 071101-1 to 071101-4) discloses an example in which edge dislocations and screw dislocations are $3\times10^8/cm^2$ and $6\times10^8/cm^2$, respectively, by introducing a $(Al_x, Ga_{1-x})_2O_3$ layer (x=0.2 to 0.9) as a buffer layer between sapphire and an $\alpha$-$Ga_2O_3$ layer.

CITATION LIST

Patent Literature

Patent Literature 1: JP2014-72533A
Patent Literature 2: JP2016-25256A

Non-Patent Literature

Non-Patent Literature 1: Riena Jinno et al., "Reduction in edge dislocation density in corundum-structured $\alpha$-$Ga_2O_3$ layers on sapphire substrates with quasi-graded $\alpha$-$(Al,Ga)_2O_3$ buffer layers", Applied Physics Express, Japan, The Japan Society of Applied Physics, Jun. 1, 2016, vol. 9, pages 071101-1 to 071101-4

SUMMARY OF THE INVENTION

However, the methods of introducing a buffer layer as disclosed in Non-Patent Literature 1 are insufficient for application to a power semiconductor requiring high dielectric breakdown electric field characteristics, and it is desirable to further reduce crystal defects.

The present inventors have now found that a high-quality ground substrate in which crystal defects (dislocations) in the orientation layer are significantly reduced can be provided by forming a front surface of the orientation layer on a side used for crystal growth of a nitride or oxide of a Group 13 element with a material having a corundum-type crystal structure having an a-axis length and/or c-axis length larger than that of sapphire, and causing a plurality of pores to be present in the orientation layer. The present inventors have also found that an excellent semiconductor layer can be formed by using such a high-quality ground substrate.

Therefore, an object of the present invention is to provide a high-quality ground substrate including an orientation layer used for crystal growth of a nitride or oxide of a Group 13 element, in which crystal defects (dislocations) in the orientation layer are significantly reduced.

According to an aspect of the present invention, there is provided a ground substrate comprising an orientation layer used for crystal growth of a nitride or oxide of a Group 13 element,
wherein a front surface of the orientation layer on a side used for the crystal growth is composed of a material having a corundum-type crystal structure having an a-axis length and/or c-axis length larger than that of sapphire, and
wherein a plurality of pores are present in the orientation layer.

DETAILED DESCRIPTION OF THE INVENTION

Ground Substrate

Figure 1:
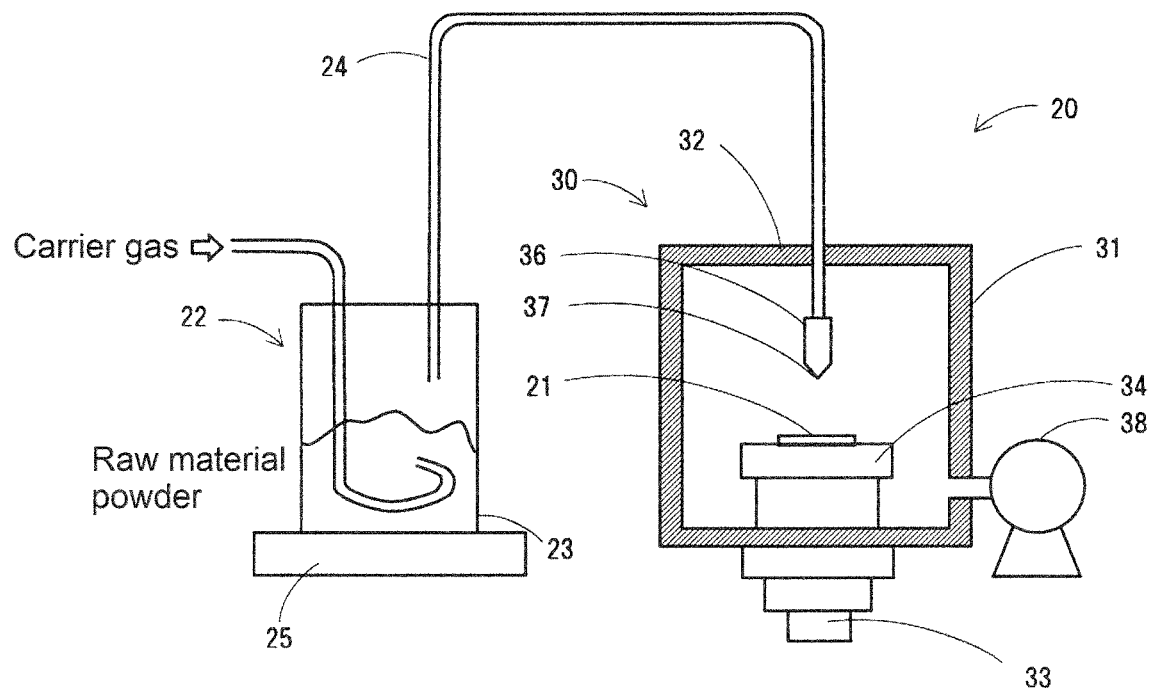
FIG. 1 is a conceptual diagram showing a configuration of an aerosol deposition (AD) apparatus.

A ground substrate according to the present invention is a ground substrate comprising an orientation layer used for crystal growth of a nitride or oxide of a Group 13 element. That is, this ground substrate is used for crystal growth of a semiconductor layer composed of a nitrides or oxide of a Group 13 element on the orientation layer. Here, the term "Group 13 element" refers to a Group 13 element according to the periodic table formulated by the IUPAC (International Union of Pure and Applied Chemistry), and specifically, is any one of boron (B), aluminum (Al), gallium (Ga), indium (In), thallium (Tl), and nihonium (Nh). The nitride and oxide of Group 13 element are typically gallium nitride (GaN) and α-gallium oxide ($\alpha$-$Ga_2O_3$).

The orientation layer has a structure in which the crystal orientations are substantially aligned in the substantially normal direction. With such a configuration, it is possible to form a semiconductor layer having excellent quality, particularly excellent orientation, on the orientation layer. That is, when the semiconductor layer is formed on the orientation layer, the crystal orientation of the semiconductor layer generally follows the crystal orientation of the orientation layer. Therefore, when the ground substrate includes an orientation layer, the semiconductor film can serve as an orientation film. The orientation layer may be a polycrystat, a mosaic crystal (a set of crystals of which crystal orientations are slightly deviated), or a single-crystal. In a case where the orientation layer is polycrystalline, it is preferably a biaxial orientation layer in which the twist direction (that is, the rotation direction about the substrate normal oriented substantially perpendicular to the substrate surface) is also substantially aligned.

The front surface of the orientation layer on the side used for crystal growth of a nitride or oxide of a Group 13 element (hereinafter, may be simply referred to as "front surface" or "orientation layer front surface") is composed of a material having a corundum-type crystal structure having an a-axis length and/or a c-axis length larger than that of sapphire ($\alpha$-$Al_2O_3$). By controlling the lattice constant of the orientation layer in this way, it is possible to significantly reduce the crystal defects in the semiconductor layer formed on the orientation layer. That is, the oxide of the Group 13 elements constituting the semiconductor layer have a lattice constant larger than that of sapphire ($\alpha$-$Al_2O_3$). In fact, as shown in Table 1 below, the lattice constant (a-axis length and c-axis length) of $\alpha$-$Ga_2O_3$, which is an oxide of Group 13 elements, are larger than the lattice constant of $\alpha$-$Al_2O_3$. Therefore, by controlling the lattice constant of the orientation layer to be larger than that of $\alpha$-$Al_2O_3$, when the semiconductor layer is formed on the orientation layer, the mismatch of the lattice constant between the semiconductor layer and the orientation layer is suppressed, and as a result, crystal defects in the semiconductor layer are reduced. For example, in a case where $\alpha$-$Ga_2O_3$ is formed on the c-plane of sapphire, the lattice length (a-axis length) in the in-plane direction of $\alpha$-$Ga_2O_3$ is substantially larger than that of sapphire, and there is a mismatch of about 5%. Therefore, by controlling the a-axis length of the orientation layer to be larger than that of $\alpha$-$Al_2O_3$, crystal defects in the $\alpha$-$Ga_2O_3$ layer can be reduced. In a case where $\alpha$-$Ga_2O_3$ is formed on the m-plane of sapphire, the lattice length (c-axis length) in the in-plane direction of $\alpha$-$Ga_2O_3$ is substantially larger than that of sapphire, and there is a mismatch of about 3%. Therefore, by controlling the c-axis length of the orientation layer to be larger than that of $\alpha$-$Al_2O_3$, crystal defects in the $\alpha$-$Ga_2O_3$ layer can be reduced. Further, GaN, which is a nitride of Group 13 elements, also has a large mismatch between sapphire and lattice constant. In a case where GaN is formed on the c-plane of sapphire, the lattice length (a-axis length) in the in-plane direction of GaN is substantially larger than that of sapphire, and there is a mismatch of about 16%. Therefore, by controlling the a-axis length of the orientation layer to be larger than that of $\alpha$-$Al_2O_3$, crystal defects in the GaN layer can be reduced. On the other hand, when these semiconductor layers are formed directly on the sapphire substrate, stress is generated in the semiconductor layer due to the mismatch of lattice constants, and a large amount of crystal defects may be generated in the semiconductor layer.

TABLE 1

Lattice constants of Group 13 oxide

| | a-axis length (Å) | c-axis length (Å) |
|---|---|---|
| $\alpha$-$Ga_2O_3$ | 4.983 | 13.433 |
| $\alpha$-$Al_2O_3$ | 4.754 | 12.990 |
| $\alpha$-$Cr_2O_3$ | 4.961 | 13.599 |
| $\alpha$-$Fe_2O_3$ | 5.038 | 13.772 |
| $\alpha$-$Ti_2O_3$ | 5.157 | 13.610 |
| $\alpha$-$V_2O_3$ | 4.949 | 13.998 |
| $\alpha$-$Rh_2O_3$ | 5.127 | 13.853 |
| $\alpha$-$In_2O_3$ | 5.487 | 14.510 |

In the ground substrate of the present invention, a plurality of pores are present in the orientation layer. The presence of these plurality of pores contributes to a significant reduction in crystal defects (dislocations) in the orientation layer. Although the mechanism is not clear, it is considered that the dislocation is absorbed by the pores and disappears. The number of pores in the orientation layer is preferably $1.0 \times 10^4$ to $1.0 \times 10^9 / cm^2$, and more preferably $1.0 \times 10^4$ to $1.0 \times 10^7 / cm^2$. In particular, in the orientation layer, the number of pores Ns in the surface layer region including the front surface used for crystal growth is smaller than the number of pores Nd in the deep layer region away from the front surface, which is preferable in that the reduction of crystal defects (dislocations) can be more effectively achieved. The number of pores Nd and Ns can be expressed in terms of the number of pores per unit cross-sectional area of 1 $cm^2$ (pores/$cm^2$) when the orientation layer is viewed in cross-section. The surface layer region and the deep layer region need only be relatively determined from the viewpoint of the thickness and the pore distribution, and need not be uniformly determined by the thickness as an absolute value, and for example, the surface layer region represents 20% of the thickness of the orientation layer from the front surface, and the deep layer region represents 80% of the thickness below. For example, in a case where the thickness of the orientation layer is 40 μm, the surface layer region is a region from the front surface of the orientation layer to a thickness of 8 μm, and the deep layer region is a region from a thickness of 8 μm to 40 μm. The ratio of the number of pores Nd in the deep layer region to the number of pores Ns in the surface layer region including the front surface (that is, Nd/Ns) is preferably larger than 1.0, more preferably 2.0 or more, and there is no particular upper limit. Within such a range, dislocations are significantly reduced and preferably almost or completely eliminated. On the other hand, the number of pores Ns in the surface layer region is preferably small. Therefore, the ratio of the number of pores Nd in the deep layer region (that is, Nd/Ns) to the number of pores Ns in the surface layer region including the front surface has no upper limit, but is preferably smaller than 60 in practice.

It is preferable that the entirety of the orientation layer is composed of a material having a corundum-type crystal structure. This also has the effect of reducing crystal defects in the orientation layer and the semiconductor layer. It is desirable that the orientation layer is formed on the surface of the sapphire substrate. $\alpha$-$Al_2O_3$ constituting the sapphire substrate has a corundum-type crystal structure, and since the orientation layer is composed of a material having a corundum-type crystal structure, the crystal structure can be made the same as that of the sapphire substrate, and as a result, the occurrence of crystal defects in the orientation layer due to crystal structure mismatch is suppressed. In this respect, it is preferable that the crystal defects in the orientation layer are reduced because the crystal defects in the semiconductor layer formed on the orientation layer are also reduced. This is because when a large number of crystal defects are present in the orientation layer, the crystal defects are also taken over to the semiconductor layer formed thereon, and as a result, crystal defects also occur in the semiconductor layer. Specific examples of the material having a corundum-type crystal structure include $\alpha$-$Al_2O_3$, $\alpha$-$Cr_2O_3$, $\alpha$-$Fe_2O_3$, $\alpha$-$Ti_2O_3$, $\alpha$-$Ga_2O_3$, $\alpha$-$V_2O_3$, $\alpha$-$Ir_2O_3$, $\alpha$-$Rh_2O_3$, $\alpha$-$In_2O_3$, or a solid solution (mixed crystal) thereof.

The material having a corundum-type crystal structure constituting the orientation layer preferably contains a material selected from the group consisting of $\alpha$-$Cr_2O_3$, $\alpha$-$Fe_2O_3$, $\alpha$-$Ti_2O_3$, $\alpha$-$V_2O_3$, $\alpha$-$Ga_2O_3$, $\alpha$-$In_2O_3$, and $\alpha$-$Rh_2O_3$, or a solid solution containing two or more selected from the group consisting of $\alpha$-$Al_2O_3$, $\alpha$-$Cr_2O_3$, $\alpha$-$Fe_2O_3$, $\alpha$-$Ti_2O_3$, $\alpha$-$V_2O_3$, $\alpha$-$Ga_2O_3$, $\alpha$-$In_2O_3$, and $\alpha$-$Rh_2O_3$, and particularly preferably is a material containing $\alpha$-$Cr_2O_3$, or a material containing a solid solution of $\alpha$-$Cr_2O_3$ and a different material. As shown in Table 1, these materials have lattice constants (a-axis length and/or c-axis length) larger than $\alpha$-$Al_2O_3$, and the lattice constants are relatively close to those of GaN and $\alpha$-$Ga_2O_3$, which are a nitride and an oxide of Group 13 elements constituting the semiconductor layer, so that crystal defects in the semiconductor layer can be effectively suppressed. The solid solution may be a substitutional solid solution or an interstitial solid solution, but is preferably a substitutional solid solution. Incidentally, the orientation layer is composed of a material having a corundum-type crystal structure, but this does not preclude the inclusion of other trace components.

The a-axis length of the material having a corundum-type crystal structure on the front surface of the orientation layer on the side used for crystal growth is larger than 4.754 Å and 5.487 Å or less, and more preferably 4.850 to 5.000 Å. It is still more preferably 4.900 to 5.000 Å. The c-axis length of the material having a corundum-type crystal structure on the front surface of the orientation layer on the side used for crystal growth is larger than 12.990 Å and 14.510 Å or less, and more preferably 13.000 to 13.800 Å. It is still more preferably 13.400 to 13.600 Å. By controlling within such a range, the a-axis length and/or the c-axis length of the front surface of the orientation layer can be close to the lattice constant (a-axis length and/or c-axis length) of the nitride or oxide of Group 13 element constituting the semiconductor layer, in particular, $\alpha$-$Ga_2O_3$.

The thickness of the orientation layer is preferably 10 µm or more, and more preferably 40 µm or more. The upper limit of the thickness is not particularly limited, but is typically 100 µm or less. The crystal defect density on the front surface of the orientation layer is preferably $1.0 \times 10^8$/$cm^2$ or less, more preferably $1.0 \times 10^6$/$cm^2$ or less, still more preferably $4.0 \times 10^3$/$cm^2$ or less, and there is no particular lower limit. In the present specification, the crystal defects refer to threading edge dislocations, threading screw dislocations, threading mixed dislocations, and basal plane dislocations, and the crystal defect density is the total of the dislocation densities. The basal plane dislocation is a problem in a case where the ground substrate including the orientation layer has an off-angle, and is not a problem because the front surface of the orientation layer is not exposed in a case where there is no off-angle. For example, when the threading edge dislocations are $3 \times 10^8$/$cm^2$, the threading screw dislocations are $6 \times 10^8$/$cm^2$, and the threading mixed dislocations are $4 \times 10^8$/$cm^2$ in the material, the crystal defect density becomes $1.3 \times 10^9$/$cm^2$.

In a case where the orientation layer is formed on a sapphire substrate, a gradient composition region having a composition varying in a thickness direction is preferably present in the orientation layer. For example, the gradient composition region preferably includes a region which is composed of a solid solution of one or more materials selected from the group consisting of $\alpha$-$Cr_2O_3$, $\alpha$-$Fe_2O_3$, $\alpha$-$Ti_2O_3$, $\alpha$-$V_2O_3$, $\alpha$-$Ga_2O_3$, $\alpha$-$In_2O_3$, and $\alpha$-$Rh_2O_3$, and $\alpha$-$Al_2O_3$, and has a gradient composition in which the solid solution amount of $\alpha$-$Al_2O_3$ decreases from the sapphire substrate side toward the orientation layer front surface side. In particular, the gradient composition region is preferably composed of a solid solution containing $\alpha$-$Al_2O_3$, $\alpha$-$Cr_2O_3$, and $\alpha$-$Ti_2O_3$, or a solid solution containing $\alpha$-$Al_2O_3$, $\alpha$-$Cr_2O_3$, $\alpha$-$Ti_2O_3$, and $\alpha$-$Fe_2O_3$. That is, it is desirable that the orientation layer is formed on the surface of the sapphire substrate, but stress due to a difference in lattice constant (a-axis length and/or c-axis length) between the sapphire substrate and the orientation layer is relaxed, and there is an effect of suppressing generation of crystal defects. In other words, it is preferable that the a-axis length and/or c-axis length is different between the front surface and the rear surface of the orientation layer, and it is more preferable that the front surface has a larger a-axis length and/or c-axis length than the rear surface of the orientation layer. With such a structure, the lattice constant varies in the thickness direction even though the orientation layer is a single-crystal, a mosaic crystal, or a biaxial orientation layer. Therefore, a single-crystal, a mosaic crystal, or a biaxially orientation layer can be formed on substrates having different lattice constants in a state where the stress is relaxed. Such a gradient composition region can be formed by heat-treating the sapphire substrate and the orientation precursor layer at a temperature of 1000° C. or greater in the production of the ground substrate described later. That is, when heat treatment is performed at such a high temperature, a reaction occurs at the interface between the sapphire substrate and the orientation precursor layer, and the Al component in the sapphire substrate diffuses into the orientation precursor layer, and the component in the orientation precursor layer diffuses into the sapphire substrate. As a result, a gradient composition region is formed in which the solid solution amount of $\alpha$-$Al_2O_3$ varies in the thickness direction. The thicker the gradient composition region, the easier it is to relax the stress caused by the difference in lattice constants, so the thicker the composition region, the better. Therefore, the thickness of the gradient composition region is preferably 5 μm or more, more preferably 20 μm or more. The upper limit of the thickness is not particularly limited, but is typically 100 μm or less. Further, by performing the heat treatment at 1000° C. or greater, the crystal defects reaching the front surface of the orientation layer can be effectively reduced. The reason for this is not clear, but it is considered that heat treatment at high temperature promotes annihilation of crystal defects.

According to a more preferred embodiment of the present invention, the orientation layer has a composition stable region located near the front surface and having a composition stable in a thickness direction, and a gradient composition region located far from the front surface and having a composition varying in the thickness direction. The composition stable region is a region in which the change in the content ratio of each metal element is less than 1.0 at %, and the gradient composition region is a region in which the change in the content ratio of each metal element is 1.0 at % or more. For example, the composition stable region and the gradient composition region can be determined as follows. First, a cross-sectional sample of the orientation layer is provided, and an energy dispersive X-ray analysis (EDS) is performed at any ten locations in the vicinity of the front surface of the orientation layer, and an average value of the content ratio (at %) of the detected metal element is calculated. Next, EDS analysis is performed at arbitrary ten points apart from the front surface by 2 μm in the thickness direction, and the average value of the content ratio (at %) at the 2 μm thickness point is calculated. At this time, the average value of the content ratio between the front surface and the point of 2 μm thickness is compared, and the difference in the content ratio of at least one kind of metal element among all detected metal elements is less than 1.0 at % or 1.0 at % or more, and can be assigned to either the composition stable region or the gradient composition region for the region from the front surface to 2 μm thickness. In the same way, by calculating the average value of the content ratio of the metal element for every 2 μm in the thickness direction and comparing the average value of the content ratio of the metal element between a certain thickness point and a point separated by 2 μm in the thickness direction, it is possible to determine the attribution of the region between the points. For example, the region between the point having a thickness of 24 μm and the point having a thickness of 26 μm from the front surface can be assigned by calculating the average value of the metal element content ratio at each point and comparing them. For example, in a case where the gradient composition region contains Al, it is more preferable that the Al concentration decreases in the thickness direction toward the composition stable region. In this embodiment, the material having a corundum-type crystal structure preferably contains one or more materials selected from the group consisting of α-$Cr_2O_3$, α-$Fe_2O_3$, and α-$Ti_2O_3$ or a solid solution thereof, or a solid solution containing α-$Al_2O_3$ and one or more materials selected from the group consisting of α-$Cr_2O_3$, α-$Fe_2O_3$, and α-$Ti_2O_3$. Particularly preferably, the gradient composition region is composed of a solid solution containing α-$Cr_2O_3$ and α-$Al_2O_3$. The composition stable region may be a material having a lattice constant (a-axis length and/or c-axis length) larger than that of α-$Al_2O_3$, may be a solid solution containing a plurality of corundum-type materials, or may be a corundum-type material single phase. That is, the material constituting the composition stable region is preferably (i) one material selected from the group consisting of α-$Cr_2O_3$, α-$Fe_2O_3$, α-$Ti_2O_3$, α-$V_2O_3$, α-$Ga_2O_3$, α-$In_2O_3$, and α-$Rh_2O_3$, or (ii) a solid solution containing one or more materials selected from the group consisting of α-$Cr_2O_3$, α-$Fe_2O_3$, α-$Ti_2O_3$, α-$V_2O_3$, α-$Ga_2O_3$, α-$In_2O_3$, and α-$Rh_2O_3$, or (iii) a solid solution of one or more materials selected from the group consisting of α-$Cr_2O_3$, α-$Fe_2O_3$, α-$Ti_2O_3$, α-$V_2O_3$, α-$Ga_2O_3$, α-$In_2O_3$, and α-$Rh_2O_3$, and α-$Al_2O_3$. From the viewpoint of controlling the lattice constant, it is preferable that the material is composed of a single phase containing no α-$Al_2O_3$ or a solid solution thereof.

The material constituting the orientation layer is not particularly limited as long as it has an orientation layer with respect to the surface of the ground substrate, and is, for example, c-axis orientation, a-axis orientation, or m-axis orientation. By doing so, when the semiconductor layer is formed on the ground substrate, the semiconductor film can be a c-axis orientation film, an a-axis orientation film, or an m-axis orientation film.

The orientation layer is preferably a heteroepitaxial growth layer. For example, in a case where the orientation layer is grown on the sapphire substrate, since both the sapphire substrate and the orientation layer have a corundum-type crystal structure, epitaxial growth in which the crystal plane of the orientation layer is arranged according to the crystal orientation of the sapphire substrate may occur during the heat treatment in a case where the lattice constants of the sapphire substrate and the orientation layer are close to each other. By epitaxially growing the orientation layer in this way, the orientation layer can inherit the high crystallinity and crystal orientation peculiar to the single-crystal of the sapphire substrate.

The arithmetic mean roughness Ra on the front surface of the orientation layer is preferably 1 nm or less, more preferably 0.5 nm or less, and still more preferably 0.2 nm or less. It is considered that the crystallinity of the semiconductor layer provided thereon is further improved by smoothing the front surface of the orientation layer in this way.

The ground substrate has an area of preferably 20 $cm^2$ or more, more preferably 70 $cm^2$ or more, and still more preferably 170 $cm^2$ or more on one side thereof. By increasing the area of the ground substrate in this way, it is possible to increase the area of the semiconductor layer formed on the substrate. Therefore, it is possible to obtain a large number of semiconductor elements from one semiconductor layer, and further reduction in production cost is expected. The upper limit of the size is not particularly limited, but is typically 700 $cm^2$ or less on one side.

The ground substrate of the present invention preferably further includes a support substrate on the side opposite to the front surface (that is, the rear surface side) of the orientation layer. That is, the ground substrate of the present invention may be a composite ground substrate including a support substrate and an orientation layer provided on the support substrate. The support substrate is preferably a sapphire substrate or a corundum single-crystal such as $Cr_2O_3$, and particularly preferably a sapphire substrate. By using a corundum single-crystal as the support substrate, the orientation layer can also serve as a seed crystal for heteroepitaxial growth. Further, by forming the structure including the corundum single-crystal as described above, a semiconductor layer having excellent quality can be obtained. That is, the corundum single-crystal has characteristics such as excellent mechanical properties, thermal properties, and chemical stability. In particular, sapphire has a high thermal conductivity of 42 W/m·K at room temperature and is excellent in thermal conductivity. Therefore, by using a composite ground substrate including a sapphire substrate, the thermal conductivity of the entire substrate can be improved. As a result, when the semiconductor layer is formed on the composite ground substrate, it is expected that the temperature distribution in the substrate surface is prevented from becoming non-uniform, and the semiconductor layer having a uniform film thickness can be obtained. Further, a sapphire substrate having a large area is easily available, so that the overall cost can be reduced and a semiconductor layer having a large area can be obtained.

The sapphire substrate may have any orientation plane. That is, the sapphire substrate may have an a-plane, a c-plane, an r-plane, or an m-plane, or may have a predetermined off-angle with respect to these planes. Further, sapphire to which a dopant is added may be used in order to adjust the electrical characteristics. As such a dopant, a known dopant can be used.

A semiconductor layer composed of a nitride or oxide of Group 13 element can be formed using the orientation layer of the ground substrate according to the present invention. The semiconductor layer can be formed by a known method, but is preferably formed by any of vapor phase film forming methods such as various CVD methods, an HVPE method, an MBE method, a PLD method, and a sputtering method, and liquid phase film forming methods such as a hydrothermal method and an Na flux method. Examples of the CVD method include a thermal CVD method, a plasma CVD method, a mist CVD method, and an MO (organic metal) CVD method. Among these, the mist CVD method, the hydrothermal method, or the HVPE method is particularly preferable for forming the semiconductor layer composed of the oxide of Group 13 element.

The ground substrate of the present invention may be in the form of a self-standing substrate having an orientation layer alone, or may be in the form of a composite ground substrate with a support substrate such as a sapphire substrate. Therefore, if desired, the orientation layer may ultimately be separated from the support substrate, such as a sapphire substrate. The separation of the support substrate may be performed by a known method and is not particularly limited. Examples thereof include a method of separating an orientation layer by applying mechanical impact, a method of separating an orientation layer by applying heat and utilizing thermal stress, a method of separating an orientation layer by applying vibration such as ultrasonic waves, a method of separating an orientation layer by etching an unnecessary portion, a method of separating an orientation layer by laser lift-off, and a method of separating an orientation layer by mechanical processing such as cutting or polishing. Further, in the case of heteroepitaxially growing the orientation layer on the sapphire substrate, the orientation layer may be installed on another support substrate after the sapphire substrate is separated. The material of the other support substrate is not particularly limited, but a suitable material may be selected from the viewpoint of material properties. For example, from the viewpoint of thermal conductivity, a metal substrate made of Cu or the like, a ceramic substrate made of SiC, AlN or the like, or the like may be used.

Production Method

The ground substrate of the present invention can be preferably produced by (a) providing a sapphire substrate, (b) preparing a predetermined orientation precursor layer, (c) performing heat treatment on the orientation precursor layer on the sapphire substrate to convert at least a portion near the sapphire substrate into an orientation layer, and optionally (d) subjecting the orientation layer to processing such as grinding or polishing to expose the surface of the orientation layer. This orientation precursor layer becomes an orientation layer by heat treatment and contains a material having a corundum-type crystal structure having an a-axis length and/or c-axis length larger than that of $\alpha$-$Al_2O_3$, or a material capable of having a corundum-type crystal structure having an a-axis length and/or c-axis length larger than that of $\alpha$-$Al_2O_3$ by heat treatment to be described later. Further, the orientation precursor layer may contain trace components in addition to the material having a corundum-type crystal structure. According to such a production method, the growth of the orientation layer can be promoted by using the sapphire substrate as a seed crystal. That is, the high crystallinity and crystal orientation peculiar to the single-crystal of the sapphire substrate are inherited by the orientation layer.

(a) Provision of Sapphire Substrate

To prepare a ground substrate, first, a sapphire substrate is provided. The sapphire substrate used may have any orientation plane. That is, the sapphire substrate may have an a-plane, a c-plane, an r-plane, or an m-plane, or may have a predetermined off-angle with respect to these planes. For example, in a case where a c-plane sapphire is used, since the c-axis is oriented with respect to the surface, it is possible to easily heteroepitaxially grow a c-axis oriented orientation layer thereon. A sapphire substrate to which a dopant is added may also be used to adjust electrical properties. As such a dopant, a known dopant can be used.

(b) Preparation of Orientation Precursor Layer

An orientation precursor layer containing a material having a corundum-type crystal structure having an a-axis length and/or c-axis length larger than that of sapphire, or a material capable of having a corundum-type crystal structure having an a-axis length and/or c-axis length larger than that of sapphire by heat treatment is prepared. The method for forming the orientation precursor layer is not particularly limited as long as the orientation layer having pores is formed after the heat treatment, and a known method can be adopted. Pores may be formed in the orientation precursor layer, the orientation precursor layer may be dense, or pores may be generated during the formation of the orientation layer. However, from the viewpoint of controlling the state of pore formation, pores are preferably formed in the orientation precursor layer. Examples of the method for forming such an orientation precursor layer include an aerosol deposition (AD) method, a sol-gel method, a hydrothermal method, a sputtering method, an evaporation method, various chemical vapor deposition (CVD) methods, a PLD method, and a chemical vapor transport (CVT) method, and a method of forming an orientation precursor layer directly on a sapphire substrate can be used. Examples of the CVD method include a thermal CVD method, a plasma CVD method, a mist CVD method, and an MO (organic metal) CVD method. Alternatively, a method may be used in which a molded body of the orientation precursor is prepared in advance and the molded body is placed on a sapphire substrate. Such a molded body can be produced by molding the material of the orientation precursor by a method such as tape molding or press molding. Further, it is also possible to use a method in which a polycrystal prepared in advance by various CVD methods, sintering, or the like is used as the orientation precursor layer and is placed on a sapphire substrate. In this case as well, it is preferable that the polycrystal contains pores.

However, a method of forming the orientation precursor layer directly by using an aerosol deposition (AD) method, various CVD methods, or a sputtering method are preferred. By using these methods, an orientation precursor layer can be formed in a relatively short time, and heteroepitaxial growth using a sapphire substrate as a seed crystal can be easily caused. In particular, the AD method does not require a high vacuum process, and is therefore preferable in terms of production cost. The sputtering method can be performed using a target of the same material as that of the orientation precursor layer, but a reactive sputtering method in which a film is formed in an oxygen atmosphere using a metal target can also be used. A method of placing a molded body prepared in advance on sapphire is also preferable as a simple method. In the method of using a polycrystalline prepared in advance as an orientation precursor layer, two steps of a step of preparing a polycrystalline body and a step of performing heat treatment on a sapphire substrate are required. Further, in order to improve the adhesion between the polycrystal and the sapphire substrate, it is necessary to take measures such as keeping the surface of the polycrystal sufficiently smooth. Although known conditions can be used for any of the methods, a method of directly forming an orientation precursor layer using an AD method and a method of placing a molded body prepared in advance on a sapphire substrate will be described below.

The AD method is a technique for forming a film by mixing fine particles or a fine particle raw material with a gas to form an aerosol, and impacting the aerosol on a substrate by injecting the aerosol at a high speed from a nozzle, and has a feature of forming a film at ordinary temperature. FIG. 1 shows an example of a film forming apparatus (aerosol deposition (AD) apparatus) used in such an AD method. The film forming apparatus 20 shown in FIG. 1 is configured as an apparatus used in an AD method in which a raw material powder is injected onto a substrate in an atmosphere having a pressure lower than atmospheric pressure. The film forming apparatus 20 includes an aerosol generating unit 22 that generates an aerosol of raw material powder containing raw material components, and a film forming unit 30 that forms a film containing the raw material components by injecting the raw material powder onto the sapphire substrate 21. The aerosol generating unit 22 includes an aerosol generating chamber 23 that stores raw material powder and receives a carrier gas supply from a gas cylinder (not shown) to generate an aerosol, and a raw material supply pipe 24 that supplies the generated aerosol to the film forming unit 30, and a vibrator 25 that applies vibration at frequencies of 10 to 100 Hz to the aerosol generating chamber 23 and the aerosol therein. The film forming unit 30 has a film forming chamber 32 that injects aerosols onto the sapphire substrate 21, a substrate holder 34 that is disposed inside the film forming chamber 32 and fixes the sapphire substrate 21, and an X-Y stage 33 that moves the substrate holder 34 in the X-Y axis direction. Further, the film forming unit 30 includes an injection nozzle 36 in which a slit 37 is formed at a tip thereof to inject aerosol into the sapphire substrate 21, and a vacuum pump 38 for reducing the pressure in the film forming chamber 32.

In the AD method, it is known that pores are generated in the film depending on the film forming conditions, or the film becomes a green compact. For example, the form of the AD film is easily affected by the collision rate of the raw material powder to the substrate, the particle size of the raw material powder, the aggregated state of the raw material powder in the aerosol, the injection amount per unit time, and the like. The collision rate of the raw material powder with the substrate is affected by the differential pressure between the film forming chamber 32 and the injection nozzle 36, the opening area of the injection nozzle, and the like. Therefore, in order to control the number of pores in the orientation precursor layer, it is necessary to appropriately control these factors.

In a case where a molded body in which the orientation precursor layer is prepared in advance is used, the raw material powder of the orientation precursor can be molded to prepare the molded body. For example, in a case where press molding is used, the orientation precursor layer is a press molded body. The press molded body can be prepared by press-molding the raw material powder of the orientation precursor based on a known method, and may be prepared, for example, by placing the raw material powder in a mold and pressing the raw material powder at pressures of preferably 100 to 400 kgf/cm$^2$, and more preferably 150 to 300 kgf/cm$^2$. The molding method is not particularly limited, and in addition to press molding, tape molding, extrusion molding, doctor blade method, and any combination thereof can be used. For example, in the case of using tape molding, it is preferable that additives such as a binder, a plasticizer, a dispersant, and a dispersion medium are appropriately added to the raw material powder to form a slurry, and the slurry is discharged and molded into a sheet shape by passing through a slit-shaped thin discharge port. The thickness of the molded body formed into a sheet is not limited, but is preferably 5 to 500 μm from the viewpoint of handling. Further, in a case where a thick orientation precursor layer is required, a large number of these sheet molded bodies may be stacked and used as a desired thickness.

In these molded bodies, the portion near the sapphire substrate becomes an orientation layer by the subsequent heat treatment on the sapphire substrate. As described above, in such a method, it is necessary to sinter the molded body in the heat treatment step described later to make it densified except for forming predetermined pores. Therefore, the molded body may contain trace components such as a sintering aid in addition to the material having or resulting in a corundum-type crystal structure. Further, from the viewpoint of introducing pores into the orientation layer, a small amount of a known pore-forming agent may be added.

(c) Heat Treatment of Orientation Precursor Layer on Sapphire Substrate

A heat treatment is performed on the sapphire substrate on which the orientation precursor layer is formed at a temperature of 1000° C. or greater. By this heat treatment, at least a portion of the orientation precursor layer near the sapphire substrate can be converted into an orientation layer. Further, this heat treatment enables heteroepitaxial growth of the orientation layer. That is, by forming the orientation layer with a material having a corundum-type crystal structure, heteroepitaxial growth occurs in which the material having a corundum-type crystal structure crystal grows using a sapphire substrate as a seed crystal during heat treatment. At that time, the crystals are rearranged, and the crystals are arranged according to the crystal plane of the sapphire substrate. As a result, the crystal axes of the sapphire substrate and the orientation layer can be aligned. For example, when a c-plane sapphire substrate is used, both the sapphire substrate and the orientation layer can be c-axis oriented with respect to the surface of the ground substrate. Moreover, this heat treatment makes it possible to form a gradient composition region in a part of the orientation layer. That is, during the heat treatment, a reaction occurs at the interface between the sapphire substrate and the orientation precursor layer, and the Al component in the sapphire substrate diffuses into the orientation precursor layer, and/or the component in the orientation precursor layer diffuses into the sapphire substrate, thereby forming a gradient composition region composed of a solid solution containing α-$Al_2O_3$.

It is known that methods such as various CVD methods, a sputtering method, a PLD method, and a CVT method may cause heteroepitaxial growth on a sapphire substrate without heat treatment at 1000° C. or greater. However, it is preferable that the orientation precursor layer is in a non-oriented state, that is, amorphous or non-oriented polycrystalline, at the time of preparation thereof, and the crystal rearrangement is caused by using sapphire as a seed crystal at the time of the heat treatment step. By doing so, it is possible to effectively reduce the crystal defects that reach the front surface of the orientation layer. The reason for this is not clear, but it is considered that the crystal structure of the solid-phase orientation precursor layer once formed may be rearranged using sapphire as a seed, which may also be effective in eliminating crystal defects.

The heat treatment is not particularly limited as long as a corundum-type crystal structure is obtained and heteroepitaxial growth using a sapphire substrate as a seed occurs, and can be performed in a known heat treatment furnace such as a tubular furnace or a hot plate. Further, in addition to the heat treatment under normal pressure (without pressing), a heat treatment under pressure such as hot pressing or HIP, or a combination of a heat treatment under normal pressure and a heat treatment under pressure can also be used. The heat treatment conditions can be appropriately selected depending on the material used for the orientation layer. For example, the atmosphere of the heat treatment can be selected from the air, vacuum, nitrogen and inert gas atmosphere. The preferred heat treatment temperature also varies depending on the material used for the orientation layer, but is preferably 1000 to 2000° C., and more preferably 1200 to 2000° C., for example. The heat treatment temperature and the retention time are related to the thickness of the orientation layer formed by heteroepitaxial growth and the thickness of the gradient composition region formed by diffusion with the sapphire substrate, and can be appropriately adjusted depending on the kind of the material, the target orientation layer, the thickness of the gradient composition region, and the like. However, in the case of using molded body prepared in advance is used as the orientation precursor layer, it is necessary to be densified except for forming predetermined pores by sintering during heat treatment, and normal pressure firing at a high temperature, hot pressing, HIP, or a combination thereof is suitable. For example, in the case of using a hot press, from the viewpoint of densification, the surface pressure is preferably 50 kgf/$cm^2$ or more, more preferably 100 kgf/$cm^2$ or more, particularly preferably 200 kgf/$cm^2$ or more, the upper limit is not particularly limited. On the other hand, from the viewpoint of introducing pores into the orientation layer, it is preferable to appropriately reduce the press pressure. The firing temperature is also not particularly limited as long as sintering and heteroepitaxial growth occur, but is preferably 1000° C. or greater, more preferably 1200° C. or greater, still more preferably 1400° C. or greater, and particularly preferably 1600° C. or greater. The firing atmosphere can also be selected from atmosphere, vacuum, nitrogen and an inert gas atmosphere. As the firing jig such as a mold, those made of graphite or alumina can be used.

(d) Exposure of Surface of Orientation Layer

On the orientation layer formed near the sapphire substrate by the heat treatment, an orientation precursor layer or a surface layer having poor orientation or no orientation may exist or remain. In this case, it is preferable that the surface derived from the orientation precursor layer is subjected to processing such as grinding or polishing to expose the surface of the orientation layer. By doing so, a material having excellent orientation is exposed on the surface of the orientation layer, so that the semiconductor layer can be effectively epitaxially grown on the material. The method for removing the orientation precursor layer and the surface layer is not particularly limited, and examples thereof include a method for grinding and polishing and a method for ion beam milling. The surface of the orientation layer is preferably polished by lapping using abrasive grains or chemical mechanical polishing (CMP).

Semiconductor Layer

A semiconductor layer composed of a nitride or oxide of Group 13 element can be formed using the ground substrate of the present invention. The semiconductor layer can be formed by a known method, but is preferably formed by any of vapor phase film forming methods such as various CVD methods, an HVPE method, a sublimation method, an MBE method, a PLD method, and a sputtering method, and liquid phase film forming methods such as a hydrothermal method and an Na flux method, and a mist CVD method, a hydrothermal method, or a HVPE method is particularly preferable. The mist CVD method will be described below.

Figure 2:
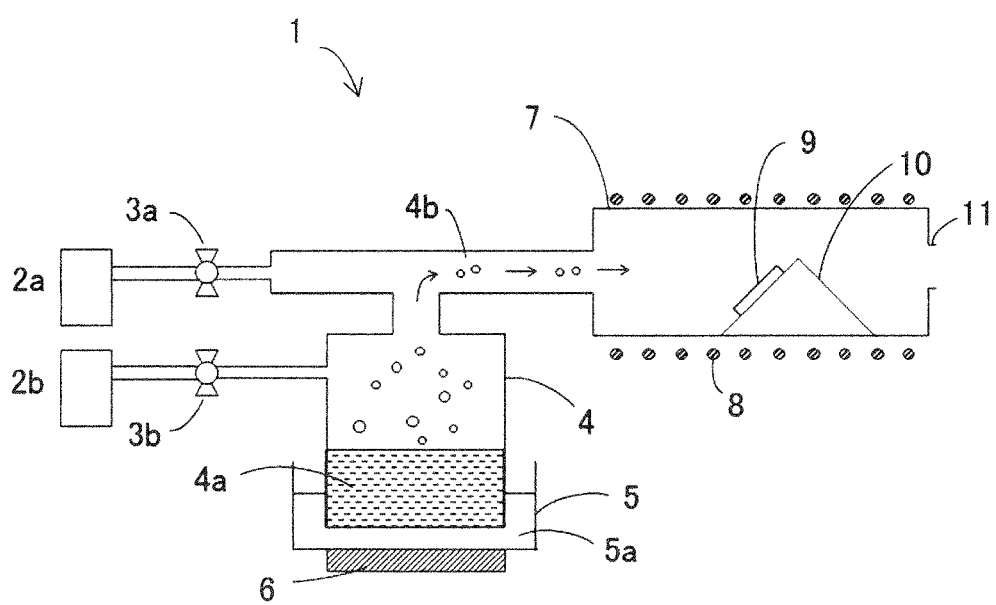
FIG. 2 is a schematic cross-sectional view showing a configuration of a mist CVD apparatus.

The mist CVD method is a method in which a raw material solution is atomized or formed into droplets to generate mist or droplets, the mist or droplets are transported to a film forming chamber including a substrate using a carrier gas, and the mist or droplets are thermally decomposed and chemically reacted in the film forming chamber to form and grow a film on the substrate, and thus does not require a vacuum process and can prepare a large number of samples in a short time. Here, FIG. 2 shows an example of a mist CVD apparatus. The mist CVD apparatus 1 shown in FIG. 2 includes a susceptor 10 on which a substrate 9 is placed, a dilution gas source 2a, a carrier gas source 2b, a flow control valve 3a for controlling a flow rate of a dilution gas sent from the dilution gas source 2a, a flow control valve 3b for controlling a flow rate of a carrier gas sent from the carrier gas source 2b, a mist generating source 4 that stores a raw material solution 4a, a vessel 5 that contains water 5a, an ultrasonic vibrator 6 attached to a bottom surface of the vessel 5, a quartz tube 7 serving as a film forming chamber, a heater 8 installed around the quartz tube 7, and an exhaust port 11. The susceptor 10 is composed of quartz, and the surface on which the substrate 9 is placed is inclined from the horizontal plane.

The raw material solution 4a used in the mist CVD method is not limited as long as a semiconductor layer composed of a nitride or oxide of Group 13 elements can be obtained, and examples thereof include an organometallic complex or halide of Ga and/or a metal forming a solid solution with Ga is dissolved in a solvent. Examples of organometallic complexes include acetylacetonate complexes. Further in a case where a dopant is added to the semiconductor layer, a solution of a dopant component may be added to the raw material solution. Furthermore, an additive such as hydrochloric acid may be added to the raw material solution. Water, alcohol, or the like can be used as the solvent.

Next, the obtained raw material solution 4a is atomized or formed into droplets to generate mist or droplet 4b. A preferable example of the atomizing or droplet forming method is a method of vibrating the raw material solution 4a using the ultrasonic vibrator 6. Then, the obtained mist or droplet 4b is transported to the film forming chamber using a carrier gas. The carrier gas is not particularly limited, but one or more of an inert gas such as oxygen, ozone and nitrogen, and a reducing gas such as hydrogen can be used.

The substrate 9 is provided in the film forming chamber (quartz tube 7). The mist or droplet 4b transported to the film forming chamber is thermally decomposed and chemically reacted there to form a film on the substrate 9. The reaction temperature varies depending on the kind of the raw material solution, but is preferably 300 to 800° C., and more preferably 400 to 700° C. Further, the atmosphere in the film forming chamber is not particularly limited as long as a desired semiconductor film can be obtained, and may be an oxygen gas atmosphere, an inert gas atmosphere, a vacuum or a reducing atmosphere, but an air atmosphere is preferable.

The semiconductor layer thus produced using the ground substrate of the present invention typically has a significantly low surface crystal defect density of $1.0 \times 10^6/cm^2$ or less. Such a semiconductor layer having an extremely low crystal defect density is excellent in dielectric breakdown electric field characteristics and is suitable for application in power semiconductors. The crystal defect density of the semiconductor layer can be evaluated by plane TEM observation (plan view) or cross-sectional TEM observation using a general transmission electron microscope (TEM). For example, in the case of observing a plan view using H-90001UHR-1 manufactured by Hitachi as the transmission electron microscope, the acceleration voltage may be 300 kV. The test piece may be cut out so as to include the film surface and processed by ion milling so that the measurement field of view is 50 μm×50 μm and the thickness of the test piece around the measurement field of view is 150 nm. By preparing 10 such test pieces and observing a TEM image with a total of 10 fields of view, the crystal defect density can be evaluated with high accuracy. The crystal defect density is preferably $1.0 \times 10^5/cm^2$ or less, and more preferably $4.0 \times 10^3/cm^2$ or less, and there is no particular lower limit.

As far as the present inventor knows, a technique for obtaining a semiconductor layer having such a low crystal defect density has not been conventionally known. For example, Non-Patent Literature 1 discloses that an $\alpha$-$Ga_2O_3$ layer is formed using a substrate in which a $(Al_x, Ga_{1-x})_2O_3$ layer (x=0.2 to 0.9) is introduced as a buffer layer between sapphire and the $\alpha$-$Ga_2O_3$ layer, and in the obtained $\alpha$-$Ga_2O_3$ layer, the densities of edge dislocations and screw dislocations are $3 \times 10^8/cm^2$ and $6 \times 10^8/cm^2$, respectively.

EXAMPLES

The present invention will be described in more detail with reference to the following examples.

Example 1

(1) Preparation of Orientation Precursor Layer

An AD film was formed on a seed substrate (sapphire substrate) by an aerosol deposition (AD) apparatus shown in FIG. 1 using sapphire (diameter 50.8 mm (2 inches), thickness 0.43 mm, c-plane, off-angle 0.2°) as the substrate.

The AD film formation was performed twice by changing the crushing conditions of the raw material powder, and the film formation conditions were as follows.
(First AD Film Formation)

As a raw material powder, 4.4 parts by weight of $TiO_2$ powder was added to 100 parts by weight of commercially available $Cr_2O_3$ powder and wet-mixed to prepare a mixed powder, and the mixed powder was then subjected to pulverization treatment in a pot mill to have a particle size $D_{50}$ of 0.3 μm. $N_2$ was used as a carrier gas, and a ceramic nozzle having a slit having a long side of 5 mm and a short side of 0.3 mm was used. The scanning conditions of the nozzle were to move 55 mm in the direction perpendicular to the long side of the slit and forward, to move 5 mm in the long side direction of the slit, to move 55 mm in the direction perpendicular to the long side of the slit and backward, and to move 5 mm in the long side direction of the slit and opposite to the initial position, repeatedly at a scanning speed of 0.5 mm/s, and at the time of 55 mm movement from the initial position in the long side direction of the slit, scanning was performed in the direction opposite to the previous direction, and the nozzle returned to the initial position. This was defined as one cycle, and repeated for 150 cycles. In one cycle of film formation at room temperature, the set pressure of the transport gas was adjusted to 0.06 MPa, the flow rate was adjusted to 6 L/min, and the pressure in the chamber was adjusted to 100 Pa or less.
(Second AD Film Formation)

As the raw material powder, powder obtained by wet-mixing a commercially available $Cr_2O_3$ powder and $TiO_2$ powder, and then being subjected to pulverization treatment in a pot mill to have a particle size $D_{50}$ of 0.4 μm was used. $N_2$ was used as a carrier gas, and a ceramic nozzle having a slit having a long side of 5 mm and a short side of 0.3 mm was used. The scanning conditions of the nozzle were to move 55 mm in the direction perpendicular to the long side of the slit and forward, to move 5 mm in the long side direction of the slit, to move 55 mm in the direction perpendicular to the long side of the slit and backward, and to move 5 mm in the long side direction of the slit and opposite to the initial position, repeatedly at a scanning speed of 0.5 mm/s, and at the time of 55 mm movement from the initial position in the long side direction of the slit, scanning was performed in the direction opposite to the previous direction, and the nozzle returned to the initial position. This was defined as one cycle, and repeated for 250 cycles. In one cycle of film formation at room temperature, the set pressure of the transport gas was adjusted to 0.06 MPa, the flow rate was adjusted to 6 L/min, and the pressure in the chamber was adjusted to 100 Pa or less.

The total thickness of the AD films obtained by the first and second AD film formations was about 80 μm.
(2) Heat Treatment of Orientation Precursor Layer The sapphire substrate on which the AD film was formed was taken out from the AD apparatus and annealed at 1600° C. for 4 hours in a nitrogen atmosphere.
(3) Measurement of Crystal Growth Thickness A sample separately prepared by the same method as in (1) and (2) above was prepared and cut so as to penetrating the center portion of the substrate in a direction orthogonal to the plate surface. The cross-section of the cut sample was smoothed by lapping using diamond abrasive grains, and mirror-finished by chemical mechanical polishing (CMP) using colloidal silica. The obtained cross-section was photographed with a scanning electron microscope (SU-5000, manufactured by Hitachi High-Technologies Corporation). By observing the reflected electron image of the cross-section after polishing, it was possible to identify the orientation precursor layer and the orientation layer that remained as polycrystals by the channeling contrast due to the difference in crystal orientation. As a result of estimating the thickness of each layer in this way, the film thickness of the orientation layer was about 60 μm, and the film thickness of the polycrystalline portion was about 20 μm.
(4) Grinding and Polishing The surface of the obtained substrate on the side derived from the AD film was ground using a grinding stone having a grit size of #2000 or less until the orientation layer was exposed, and then the plate surface was further smoothed by lapping using diamond abrasive grains. Thereafter, mirror finishing was performed by chemical mechanical polishing (CMP) using colloidal silica to obtain a composite ground substrate having an orientation layer on a sapphire substrate. The surface of the substrate on the side derived from the AD film was designated as the "front surface". The amount of grinding and polishing was about 40 μm including the polycrystalline portion and the orientation layer, and the thickness of the orientation layer formed on the composite ground substrate was about 40 μm.

(5) Evaluation of Orientation Layer
(5a) Cross-Section EBSD

The composite ground substrate prepared in (4) above was cut so as to penetrating the center portion of the substrate in a direction orthogonal to the plate surface. The cross-section of the cut sample was smoothed by lapping using diamond abrasive grains, and mirror-finished by chemical mechanical polishing (CMP) using colloidal silica. Next, the reverse pole figure orientation mapping of the orientation layer cross-section was measured by the electron backscatter diffraction (EBSD) pattern method. Specifically, using a scanning electron microscope (SU-5000, manufactured by Hitachi High-Technologies Corporation) equipped with EBSD (Nordlys Nano, manufactured by Oxford Instruments Inc.), the reverse pole figure orientation mapping of the orientation layer cross-section under the following conditions in a field of view of 50 μm×100 μm.

<EBSD Measurement Conditions>
Acceleration voltage: 15 kV
Spot intensity: 70
Working distance: 22.5 mm
Step size: 0.5 μm
Sample tilt angle: 70°
Measurement program: Aztec (version 3.3)

From the reverse pole figure orientation mapping of the cross-section, it was shown that the inside of the orientation layer was oriented in the same direction as the sapphire substrate in both the substrate normal direction and the in-plane direction, and that the corundum layer was biaxially oriented.

(5b) Cross-Section EDS

Next, the composition of the cross-section orthogonal to the main surface of the substrate was analyzed using an energy dispersive X-ray analyzer (EDS). As a result, Cr, O, Al and Ti were detected in the thickness region up to about 40 μm from the front surface of the substrate. In the thickness region up to about 10 μm, the difference in the content ratio of each element of Cr, Al, and Ti between the surfaces separated by 2 μm in the thickness direction was less than 1.0 at %, indicating that a Cr—Ti—Al oxide layer having a thickness of about 10 μm was formed as a composition stable region. Further, Cr, O, Al, and Ti were also detected in a range of a thickness of about 30 μm of a lower layer (that is, a thickness region of about 10 to 40 μm) of the Cr—Ti—Al oxide layer. In the thickness region of about 10 to 40 μm, the content ratio of each element of Cr, Ti, and Al was significantly different in the thickness direction, and it was observed that the Al concentration was high on the sapphire substrate side and the Al concentration was decreased on the side close to the composition stable region. In the thickness region of about 10 to 40 μm, the difference in the Al content ratio between the surfaces separated by 2 μm in the thickness direction was 1.2 to 11.2 at %, so that it was confirmed that the reaction layer formed a gradient composition region. Furthermore, only O and Al were detected under the gradient composition region, and it was shown that the substrate was a sapphire substrate. Further, from the reverse pole figure mapping of (5a) above and the result of the EDS analysis above, it was shown that Cr, Ti, Al and O were present in the biaxially oriented corundum layer, suggesting that the biaxial orientation layer was a solid solution of $Cr_2O_3$, $Ti_2O_3$ and $Al_2O_3$.

(5c) XRD

XRD in-plane measurement of the substrate front surface was performed using a multifunctional high-resolution X-ray diffractometer (D8 DISCOVER, manufactured by Bruker AXS Inc.). Specifically, after the Z axis was adjusted in accordance with the height of the substrate front surface, the axis was set by adjusting Chi, Phi, ω, and 2θ with respect to the (11-20) plane, and 2θ-ω measurement was performed under the following conditions.

Tube voltage: 40 kV
Tube current: 40 mA
Detector: Triple Ge (220) Analyzer
CuKα rays converted to parallel monochromatic light (half width 28 seconds) with a Ge (022) asymmetric reflection monochromator.
Step width: 0.001°
Scan speed: 1.0 second/step As a result, it was found that the a-axis length of the front surface of the orientation layer was 4.954 Å. As a result of EDS measurement, it was shown that the rear surface of the orientation layer (interface with the sapphire substrate) contained almost no Cr and Ti. Therefore, the a-axis length of the rear surface of the orientation layer was estimated to be 4.754 Å, suggesting that the a-axis length is different between the front surface and the rear surface of the orientation layer.

(5d) Plane TEM

In order to evaluate the crystal defect density of the orientation layer, a plane TEM observation (plan view) was performed using a transmission electron microscope (H-90001UHR-I manufactured by Hitachi). A sample piece was cut out parallel to the surface of the orientation layer (that is, in the horizontal direction) so as to include the surface of the orientation layer, and processed by ion milling so that the sample thickness (T) around the measurement field of view was 150 nm. The TEM observation of the obtained section was performed in 10 fields of view at an acceleration voltage of 300 kV and a measurement field of view of 50 μm×50 μm to evaluate the crystal defect density, and as a result, the crystal defect density was $8.0 \times 10^3/cm^2$.

(5e) Pore Observation

The pores of the cross-section polished sample prepared in (5a) above were evaluated using a scanning electron microscope (SU-5000, manufactured by Hitachi High-Technologies Corporation). Specifically, 25 fields of view of secondary electron images were photographed at a measurement magnification of 500 times (size of one field of view: 178 μm×256 μm) with respect to an arbitrary region of the biaxial orientation layer (thickness: about 40 μm), and the number of pores Nd in a deep layer region (region having a thickness of about 32 μm from the interface with the sapphire substrate) in the biaxial orientation layer and the number of pores Ns included in a surface layer region (region having a thickness of about 8 μm from the front surface of the biaxially oriented layer) were evaluated. Those having a pore size of 0.3 μm or more were regarded as pores, and the number of pores was visually counted from the photographed secondary electron image and evaluated as the number of pores per unit cross-sectional area of 1 cm². As a result, the number of pores (Nd+Ns) in the orientation layer region was 1.4×10⁶/cm², and the ratio Nd/Ns of Nd to Ns was 3.7.

Example 2

In the above (1), a composite ground substrate was prepared and evaluated in the same manner as in Example 1, except that as the raw material powder for the first AD film formation, a material having a particle size $D_{50}$ of 0.4 μm after the grinding of the $Cr_2O_3$—$TiO_2$ mixed powder was used, and as the raw material powder for the second AD film formation, a material having a particle size $D_{50}$ of 0.5 μm after the grinding of the $Cr_2O_3$—$TiO_2$ mixed powder was used.

The total thickness of the AD film obtained by the first and second AD film formation was about 80 μm as in Example 1. As a result of cross-sectional observation of the AD film after the heat treatment with a scanning electron microscope, the film thickness of the orientation layer was about 60 μm, and the film thickness of the polycrystalline portion was about 20 μm. As in Example 1, surface grinding and polishing were performed to obtain a composite ground substrate. The amount of grinding and polishing was about 40 μm including the polycrystalline portion and the orientation layer, and the film thickness of the orientation layer formed on the composite ground substrate was about 40 μm as in Example 1. From the reverse pole figure orientation mapping of the cross-section measured using EBSD, it was shown that the inside of the orientation layer was oriented in the same direction as the sapphire substrate in both the substrate normal direction and the in-plane direction, and that the corundum layer was biaxially oriented.

From the cross-sectional EDS of the composite ground substrate, Cr, Ti, O and Al were detected in a thickness region up to about 10 μm from the substrate front surface. In the thickness region up to about 10 μm, the difference in the content ratio of each element of Cr, Al, and Ti between the surfaces separated by 2 μm in the thickness direction was less than 1.0 at %, so that it was found that a Cr—Ti—Al oxide layer having a thickness of about 10 μm was formed as a composition stable region. Further, Cr, O, Al, and Ti were also detected in a range of a thickness of about 30 μm of a lower layer (that is, a thickness region of about 10 to 40 μm) of the Cr—Ti—Al oxide layer. In the thickness region of about 10 to 40 μm, the content ratio of each element of Cr, Ti, and Al was significantly different in the thickness direction, and it was observed that the Al concentration was high on the sapphire substrate side and the Al concentration was decreased on the side close to the composition stable region. In the thickness region of about 10 to 40 μm, the difference in the Al ratio between the surfaces separated by 2 μm in the thickness direction was 1.2 to 11.2 at %, so that it was confirmed that the reaction layer formed a gradient composition region. Furthermore, only O and Al were detected under the gradient composition region, and it was shown that the substrate was a sapphire substrate. Further, from the reverse pole figure mapping and the result of the EDS analysis, it was shown that Cr, Ti, Al and O were present in the biaxially oriented corundum layer, suggesting that the biaxial orientation layer was a solid solution of $Cr_2O_3$, $Ti_2O_3$ and $Al_2O_3$. From the XRD measurement, it was found that the a-axis length of the front surface of the orientation layer was 4.954 Å. As a result of EDS measurement, it was shown that the rear surface of the orientation layer (interface with the sapphire substrate) contained almost no Cr and Ti. Therefore, the a-axis length of the rear surface of the orientation layer was estimated to be 4.754 Å, suggesting that the a-axis length is different between the front surface and the rear surface of the orientation layer. As a result of plane TEM observation, the crystal defect density was 8.0×10³/cm². From the observation of the pores by the secondary electron image of the scanning electron microscope, the number of pores (Nd+Ns) in the orientation layer region were 3.6×10⁵/cm², and the ratio Nd/Ns of Nd to Ns was 5.0.

Example 3

In the above (1), a composite ground substrate was prepared and evaluated in the same manner as in Example 1, except that as the raw material powder for the second AD film formation, a material having a particle size $D_{50}$ of 0.2 μm after the grinding of the $Cr_2O_3$—$TiO_2$ mixed powder was used.

The total thickness of the AD film obtained by the first and second AD film formation was about 80 μm as in Example 1. As a result of cross-sectional observation of the AD film after the heat treatment with a scanning electron microscope, the film thickness of the orientation layer was about 60 μm, and the film thickness of the polycrystalline portion was about 20 μm. As in Example 1, surface grinding and polishing were performed to obtain a composite ground substrate. The amount of grinding and polishing was about 40 μm including the polycrystalline portion and the orientation layer, and the film thickness of the orientation layer formed on the composite ground substrate was about 40 μm as in Example 1. From the reverse pole figure orientation mapping of the cross-section measured using EBSD, it was shown that the inside of the orientation layer was oriented in the same direction as the sapphire substrate in both the substrate normal direction and the in-plane direction, and that the corundum layer was biaxially oriented.

From the cross-sectional EDS of the composite ground substrate, Cr, Ti, O and Al were detected in a thickness region up to about 10 μm from the substrate front surface. In the thickness region up to about 10 μm, the difference in the content ratio of each element of Cr, Al, and Ti between the surfaces separated by 2 μm in the thickness direction was less than 1.0 at %, so that it was found that a Cr—Ti—Al oxide layer having a thickness of about 10 μm was formed as a composition stable region. Further, Cr, O, Al, and Ti were also detected in a range of a thickness of about 30 μm of a lower layer (that is, a thickness region of about 10 to 40 μm) of the Cr—Ti—Al oxide layer. In the thickness region of about 10 to 40 μm, the content ratio of each element of Cr, Ti, and Al was significantly different in the thickness direction, and it was observed that the Al concentration was high on the sapphire substrate side and the Al concentration was decreased on the side close to the composition stable region. In the thickness region of about 10 to 40 μm, the difference in the Al content ratio between the surfaces separated by 2 μm in the thickness direction was 1.2 to 11.2 at %, so that it was confirmed that the reaction layer formed a gradient composition region. Furthermore, only O and Al were detected under the gradient composition region, and it was shown that the substrate was a sapphire substrate. Further, from the reverse pole figure mapping and the result of the EDS analysis, it was shown that Cr, Ti, Al and O were present in the biaxially oriented corundum layer, suggesting that the biaxial orientation layer was a solid solution of $Cr_2O_3$, $Ti_2O_3$ and $Al_2O_3$. From the XRD measurement, it was found that the a-axis length of the front surface of the orientation layer was 4.954 Å. As a result of EDS measurement, it was shown that the rear surface of the orientation layer (interface with the sapphire substrate) contained almost no Cr and Ti. Therefore, the a-axis length of the rear surface of the orientation layer was estimated to be 4.754 Å, suggesting that the a-axis length is different between the front surface and the rear surface of the orientation layer. As a result of plane TEM observation, the crystal defect density was $4.0 \times 10^4 / cm^2$. From the observation of the pores by the secondary electron image of the scanning electron microscope, the number of pores (Nd+Ns) in the orientation layer region were $2.0 \times 10^6 / cm^2$, and the ratio Nd/Ns of Nd to Ns was 0.5.

Example 4

In the above (1), a composite ground substrate was prepared and evaluated in the same manner as in Example 1, except that as the raw material powder for the first AD film formation, a material having a particle size $D_{50}$ of 0.1 μm obtained by grinding the $Cr_2O_3$—$TiO_2$ mixed powder was used.

The total thickness of the AD film obtained by the first and second AD film formation was about 80 μm as in Example 1. As a result of cross-sectional observation of the AD film after the heat treatment with a scanning electron microscope, the film thickness of the orientation layer was about 60 μm, and the film thickness of the polycrystalline portion was about 20 μm. As in Example 1, surface grinding and polishing were performed to obtain a composite ground substrate. The amount of grinding and polishing was about 40 μm including the polycrystalline portion and the orientation layer, and the film thickness of the orientation layer formed on the composite ground substrate was about 40 μm as in Example 1. From the reverse pole figure orientation mapping of the cross-section measured using EBSD, it was shown that the inside of the orientation layer was oriented in the same direction as the sapphire substrate in both the substrate normal direction and the in-plane direction, and that the corundum layer was biaxially oriented.

From the cross-sectional EDS of the composite ground substrate, Cr, Ti, O and Al were detected in a thickness region up to about 10 μm from the substrate front surface. In the thickness region up to about 10 μm, the difference in the content ratio of each element of Cr, Al, and Ti between the surfaces separated by 2 μm in the thickness direction was less than 1.0 at %, so that it was found that a Cr—Ti—Al oxide layer having a thickness of about 10 μm was formed as a composition stable region. Further, Cr, O, Al, and Ti were also detected in a range of a thickness of about 30 μm of a lower layer (that is, a thickness region of about 10 to 40 μm) of the Cr—Ti—Al oxide layer. In the thickness region of about 10 to 40 μm, the content ratio of each element of Cr, Ti, and Al was significantly different in the thickness direction, and it was observed that the Al concentration was high on the sapphire substrate side and the Al concentration was decreased on the side close to the composition stable region. In the thickness region of about 10 to 40 μm, the difference in the Al content ratio between the surfaces separated by 2 μm in the thickness direction was 1.2 to 11.2 at %, so that it was confirmed that the reaction layer formed a gradient composition region. Furthermore, only O and Al were detected under the gradient composition region, and it was shown that the substrate was a sapphire substrate. Further, from the reverse pole figure mapping and the result of the EDS analysis, it was shown that Cr, Ti, Al and O were present in the biaxially oriented corundum layer, suggesting that the biaxial orientation layer was a solid solution of $Cr_2O_3$, $Ti_2O_3$ and $Al_2O_3$. From the XRD measurement, it was found that the a-axis length of the front surface of the orientation layer was 4.954 Å. As a result of EDS measurement, it was shown that the rear surface of the orientation layer (interface with the sapphire substrate) contained almost no Cr and Ti. Therefore, the a-axis length of the rear surface of the orientation layer was estimated to be 4.754 Å, suggesting that the a-axis length is different between the front surface and the rear surface of the orientation layer. As a result of plane TEM observation, the crystal defect density was $4.0 \times 10^3 / cm^2$ or less. From the observation of the pores by the secondary electron image of the scanning electron microscope, the number of pores (Nd+Ns) in the orientation layer region were $2.0 \times 10^7 / cm^2$, and the ratio Nd/Ns of Nd to Ns was 58.1.

TABLE 2

| | Pore characteristics | | |
|---|---|---|---|
| | Number of pores (Nd + Ns) in orientation layer region (/cm$^2$) | Ratio Nd/Ns of number of pores Nd in deep layer region to number of pores Ns in surface layer region | Defect density (/cm$^2$) |
| Ex. 1 | $1.4 \times 10^6$ | 3.7 | $8.0 \times 10^3$ |
| Ex. 2 | $3.6 \times 10^5$ | 5.0 | $8.0 \times 10^3$ |
| Ex. 3 | $2.0 \times 10^6$ | 0.5 | $4.0 \times 10^4$ |
| Ex. 4 | $2.0 \times 10^7$ | 58.1 | $4.0 \times 10^3$ or less |

What is claimed is:

1. A ground substrate comprising an orientation layer used for crystal growth of a nitride or oxide of a Group 13 element,
    wherein a front surface of the orientation layer on a side used for the crystal growth is composed of a material having a corundum-type crystal structure having an a-axis length and/or c-axis length larger than that of sapphire,
    wherein a plurality of pores are present in the orientation layer and the number of pores in the orientation layer is $1.0 \times 10^4 / cm^2$ to $1.0 \times 10^9 / cm^2$,
    wherein the material having the corundum-type crystal structure contains one or more materials selected from the group consisting of $\alpha$-$Cr_2O_3$, $\alpha$-$Fe_2O_3$, and $\alpha$-$Ti_2O_3$ or a solid solution thereof, or a solid solution containing $\alpha$-$Al_2O_3$ and one or more materials selected from the group consisting of $\alpha$-$Cr_2O_3$, $\alpha$-$Fe_2O_3$, and $\alpha$-$Ti_2O_3$,
    wherein in the orientation layer, the number of pores in a surface layer region including the front surface is smaller than the number of pores in a deep layer region away from the front surface, and
    wherein the surface layer region represents 20% of a thickness of the orientation layer, and the deep layer region represents 80% of the remaining thickness of the orientation layer.

2. The ground substrate according to claim 1, wherein an a-axis length and/or c-axis length of the orientation layer is different between the front surface and a rear surface of the orientation layer.

3. The ground substrate according to claim 1, wherein an entirety of the orientation layer is composed of the material having the corundum-type crystal structure.

4. The ground substrate according to claim 1, wherein the a-axis length of the material having the corundum-type crystal structure on the front surface is larger than 4.754 Å and 5.487 Å or less.

5. The ground substrate according to claim 1, wherein a gradient composition region having a composition varying in a thickness direction is present in the orientation layer.

6. The ground substrate according to claim 5, wherein the gradient composition region has a thickness of 20 μm or more.

7. The ground substrate according to claim 1, wherein the orientation layer has a composition stable region having a composition stable in a thickness direction, and a gradient composition region having a composition varying in the thickness direction, and wherein the composition stable region is located at a position closer to the front surface than the gradient composition region.

8. The ground substrate according to claim 5, wherein the gradient composition region is composed of a solid solution containing $\alpha$-$Cr_2O_3$ and $\alpha$-$Al_2O_3$.

9. The ground substrate according to claim 7, wherein in the gradient composition region, an Al concentration decreases in the thickness direction toward the composition stable region.

10. The ground substrate according to claim 1, wherein the orientation layer is a heteroepitaxial growth layer.

11. The ground substrate according to claim 1, further comprising a support substrate on a side opposite to the front surface of the orientation layer.

12. The ground substrate according to claim 11, wherein the support substrate is a sapphire substrate.

* * * * *